United States Patent [19]

Ammon et al.

[11] 4,220,393

[45] Sep. 2, 1980

[54] ELECTRICAL CONNECTOR AND METHOD OF FABRICATION AND ASSEMBLY

[75] Inventors: J. Preston Ammon; Harry R. Weaver, both of Dallas; Claude Rodriguez, Carrollton, all of Tex.

[73] Assignee: Elfab Corporation, Dallas, Tex.

[21] Appl. No.: 770,578

[22] Filed: Feb. 22, 1977

Related U.S. Application Data

[63] Continuation of Ser. No. 597,751, Jul. 21, 1975, abandoned.

[51] Int. Cl.[3] ........................ H01R 13/46; H05K 1/12

[52] U.S. Cl. ................................................ 339/221 M

[58] Field of Search ............ 339/17 L, 176 R, 176 M, 339/176 MP, 258 R, 221 R, 221 M

[56] References Cited

U.S. PATENT DOCUMENTS

| | | | |
|---|---|---|---|
| 3,621,444 | 11/1971 | Stein | 339/221 M |
| 3,737,838 | 6/1973 | Mattingly | 339/176 MP |
| 3,768,068 | 10/1973 | Palecek | 339/221 M |

*Primary Examiner*—Neil Abrams
*Attorney, Agent, or Firm*—Crisman & Moore

[57] ABSTRACT

Press fit contacts having upper mating portions are stamped, formed and oriented out of sheet material for simultaneous insertion and housing in a removable connector insulator. Receiving sleeves formed in the insulator are constructed to permit the contacts to be bottom loaded into the sleeves, seated and lightly held therein. Each contact includes an intermediate press fit collar portion which engages a mating shoulder in the insulator. The insulator serves as a holding fixture and seating tool for transmitting insertion force applied to the top of the insulator to each one of the contacts for press fitting them into contact receiving apertures in a mounting substrate. The contacts held by each insulator are all simultaneously press fitted into the substrate by continuing to apply pressure to the top of the insulator until it is mounted flush upon the substrate. After the connector is assembled, the contact is in a configuration for electrical engagement with a mating contact (not disclosed) while a contact tail portion may extend below the substrate for wire wrap termination. The configuration of the assembled connector permits removal of the insulator by lifting it from around the contacts, which it lightly engages, leaving the contacts rigidly mounted in the substrate. Further, a connector assembly, comprising an insulator having contacts lightly held therein, may be readily shipped to a remote location for press fit installation in a mounting substrate.

20 Claims, 24 Drawing Figures

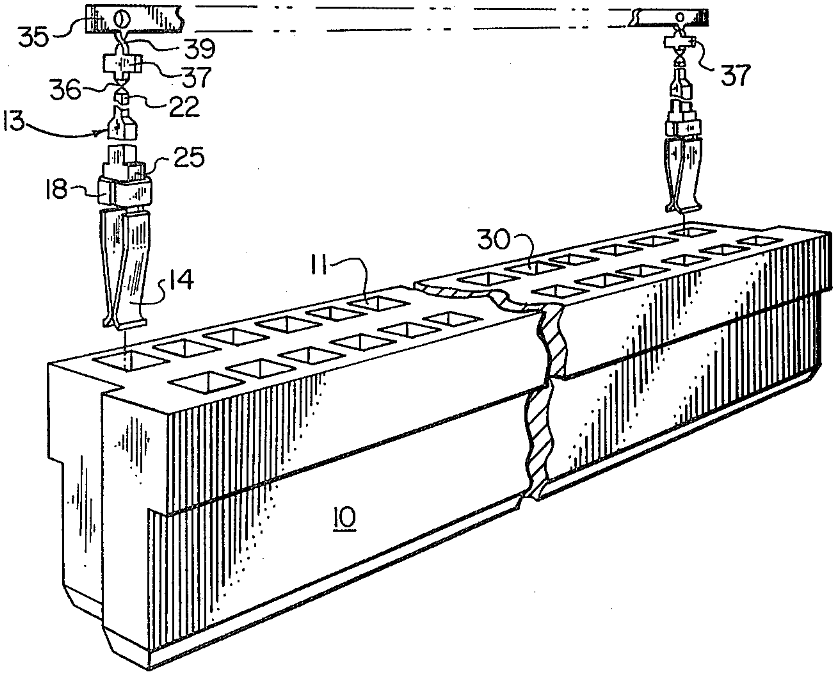
FIG. 6
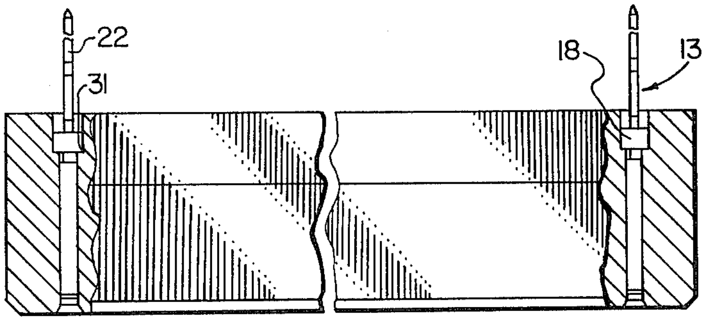
FIG. 7
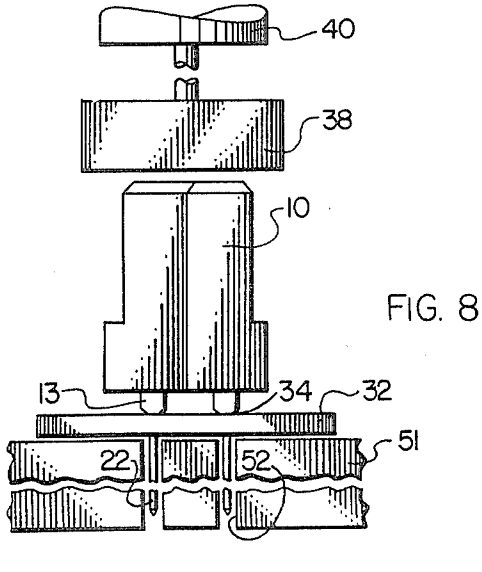
FIG. 8
FIG. 9
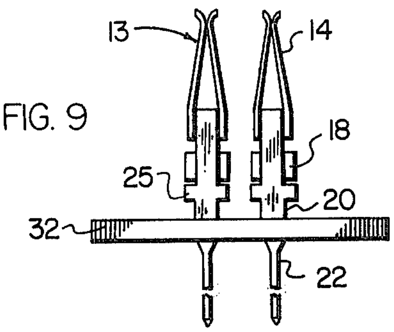

ELECTRICAL CONNECTOR AND METHOD OF FABRICATION AND ASSEMBLY

CROSS REFERENCE TO RELATED APPLICATION

This application is a continuation of prior application Ser. No. 597,751, filed July 21, 1975, now abandoned.

BACKGROUND OF THE INVENTION

This invention relates to an electrical connector, and moreparticularly, to an electrical connector having contacts formed with press fit collars, seated and lightly held within sleeves formed in a removable insulator adapted to serve as a seating tool for press fitting the contacts into receiving apertures formed in a substrate.

For certain connector applications, it is desirable to press fit contacts directly into a mounting substrate, such as a printed circuit board backpanel, to support the contacts and hold them rigidly in a fixed configuration. This press fit approach is in contrast to that of molding or otherwise directly mounting the contacts within an insulative body. Although an insulative body may be used in both instances, in the latter, the insulator is the primary structural support for the contacts, and problems arise because the insulator cannot be removed after the connector is mounted to the substrate. In that instance, it is virtually impossible to remove individual ones of the contacts from within the molded insulator and/or mounting substrate for repair in the event one of the contacts is damaged.

Certain prior art approaches to press fitted contacts have heretofore relied upon rigid, transverse extending load bearing shoulders for receiving and rigidly withstanding a press fit insertion force from an insertion tool. The load bearing surface area of each shoulder has been dependent upon the hardness of the seating tool bearing surface and the magnitude of the force necessary for press fitting. The position and shape of these press fitting shoulders on the contact has also been dependent upon the contact configuration. For example, certain contacts have been constructed for being press fitted into apertures in a mounting substrate and subsequently covered by a layover insulative housing. One such contact, of the card edge connector type, is described in U.S. Pat. No. 3,671,917, issued to John P. Ammon and Frederick T. Inacker on June 20, 1972, and assigned to the assignee of the present invention. The contact set forth therein is characterized by a fragile, or delicate, upper mating portion; i.e., a portion not capable of withstanding an axial load of the magnitude necessary for press fit insertion. The necessary load bearing shoulder for press fitting such a contact is effectively constructed beneath the upper mating portion. Once the contacts are press fitted into apertures in a mounting substrate, such as a conventional printed circuit board backpanel, the insulative housing is snapped over the top thereof.

Prior art contacts not having delicate upper portions have also been adapted for press fit application; and moreover, have been adapted for receiving the press fit insertion force directly on the topmost portion thereof. Such a contact is described and claimed in copending U.S. Patent Application Ser. No. 460,932, filed by J. Preston Ammon on Apr. 15, 1974, entitled "Folded Electrical Contact" and assigned to the assignee of the present invention. The electrical connector, and method of assembly thereof utilizing the folded contact of that invention is also described and claimed in copending U.S. Patent Application Ser. No. 460,931, filed by J. Preston Ammon on Apr. 15, 1974, entitled "Low Profile Integrated Circuit Connector and Method" and assigned to the assignee of the present invention.

The upper mating portion of the contact described in those two even date applications comprises a socket, rigid in structure and adapted for receiving and withstanding a directly applied, top loaded, press fit insertion force. Of great advantage in this approach is the availability of the insulator itself for applying the press fit insertion force directly to the contacts. Such a design eliminates separate holding fixtures and seating tools for mounting the contacts in a substrate. Unfortunately, this particular press fit design approach does not lend itself to contacts having fragile upper mating portions, such as the card edge connector type.

Related prior art approaches to press fit contacts have also included the utilization of the insulative housing as contact holding fixtures. Generally, the insulative housing has sleeves formed therein for either lightly or tightly receiving the contacts therethrough. Lightly held contacts generally have a load bearing region for engaging a separate press fitting fixture formed of a material (such as steel) having a suitably high compressive strength for withstanding the high stress concentrations of the relatively small contact load bearing areas. Such a connector and method of assembly are described and claimed in copending U.S. Patent Application Ser. No. 534,442, filed by J. Preston Ammon on Dec. 19, 1974, entitled "Electrical Connector and Method of Assembly" and assigned to the assignee of the present invention. The contact of that invention is lightly held in the insulator while a portion protrudes through the top thereof, exposing a press fit shoulder region for engaging a metal press fit tool.

Certain prior art discrete connectors have included insulators adapted for tightly holding top loaded contacts in sleeves formed therein, and in certain instances, have been used as the seating tool for press fitting the contacts in this most advantageous manner. Such approaches are illustrated in U.S. Pat. No. 3,530,422, to David S. Goodman, entitled "Connector and Method for Attaching Same to Printed Circuit Board". The connector described in the Goodman patent, includes contacts having transverse shoulders which are top loaded down into slots in the insulator. The contact tails are pulled through to seat the contacts, and the lower portion of each contact is twisted 90 degrees to lock each contact into the insulator and to provide an abutting engagement between the insulator bottom and relatively large outwardly extending shoulders formed on the contact. The contacts can then be press fitted into apertures in a substrate by applying force to the top of the insulator; however once the contacts have been fully press fitted, it is impossible to remove the insulator to expose individual ones of the contacts for repair. Further, the relatively large, outwardly extending press fitting shoulders required on the contact prevent the contacts from being mounted on relatively close spacings, e.g., on 100 mil centers.

A trend in the development of the substrate mounted connector art is that of using structures which include an insulator removable from around contacts rigidly mounted into a substrate. A principal reason for removable layover-insulators is repairability. An insulator which may be removed from around the press fitted contacts provides a means of access to those contacts and facilitates repairability. It is desirable to provide a connector with contacts having delicate upper mating portions, wherein the insulator can serve as a contact holding fixture and a press fitting tool and then be subsequently removable after the contacts are rigidly press fitted into a substrate. One problem in the design of such connectors is that the transfer of press fitting forces from the top of the insulator to each contact is aggravated by the fragile mating portions, generally characterized by upwardly extending blades or tines which are not adapted for engaging an insertion fixture or for withstanding axial loads of the magnitude necessary for press fitting.

The connector and method of the present invention is especially adapted for the improved fabrication, assembly and housing of contacts having fragile upper mating portions. The present connector and method overcome many of the disadvantages of the prior art by providing an insulative housing, which itself serves as the holding fixture and press fit tool for these contacts, and yet is removable therefrom after the contacts are rigidly installed in a substrate. In addition, the contacts may be simultaneously inserted, in their proper orientation, into the insulator sleeves, and lightly held in position so as to facilitate normal handling as a complete subassembly without the danger of the contacts falling out. Since the contacts are held within the insulator sleeves with less retention force than the press fitted contacts are held into the mounting substrate, the connector of the present invention permits ready removal of the insulator and replacement of individual contacts.

SUMMARY OF THE INVENTION

The invention relates to a connector and a method for fabricating and assembling an electrical connector which includes contacts lightly held within sleeves in a removable insulator, which insulator is specially adapted for press fitting the contacts into receiving apertures in a mounting substrate. More particularly, one aspect of the invention involves a contact for an electrical connector, wherein a plurality of the contacts having upper mating portions are formed, oriented and are simultaneously inserted into and seated within the sleeves. Each contact includes a transversely extending collar portion intermediate thereof for abuttingly engaging a mating shoulder within each sleeve. The collar may be integrally formed with the contact or assembled thereto and may be comprised of a plurality of flange surfaces. A portion of each contact beneath the collar may extend from the lower surface of the insulator, which contact portions are adapted for press fitting into receiving apertures in the substrate wherein the contacts are rigidly held.

In another aspect, the invention includes an electrical connector comprising an insulative housing including transversely extending load bearing shoulders having relatively small surface areas, yet sufficient compressive strength, for serving as a holding fixture and seating tool for a plurality of contacts bottom loaded into sleeves formed therein. The sleeves are spaced for subsequent alignment with apertures in a mounting substrate. The contacts are lightly held within the sleeves by frictional forces between the side surfaces of a transversely extending collar on the contact and the inner walls of the sleeve for facilitating the subassembly thereof. The contact collar is seated against the shoulder in the sleeve providing a mating configuration for uniformly receiving and rigidly withstanding the seating forces transmitted through the insulative housing to the contacts for the press fit insertion thereof into the mounting substrate.

In another aspect, the invention includes an insulative housing including transversely extending load bearing inserts positioned therein. The inserts are adapted for engaging an intermediate collar portion of a contact seated within the insulator and providing sufficient load bearing surface area and rigidity to transmit the required insertion force to the contact for rigidly mounting it in an aperture formed in a mounting substrate. With an insert the contact collar may be smaller than otherwise feasible due to the generally low compressive strength of the conventional thermoplastic insulator materials. The inserts may be either molded in the insulator or seated therein prior to contact loading.

In still another aspect, the invention includes an interconnection system comprising a mounting substrate having an array of contact receiving apertures, an insulative housing having contact receiving sleeves arranged for registration with the aperture array, and a plurality of contacts lightly held within the sleeves. The contacts are rigidly mounted in the apertures by insertion forces transmitted through the insulator. The interconnection system may be of the card edge or mating connector type. Each contact for the mating connector type connection system may include a pair of opposed gripping tines for receiving and conductively engaging a male contact; a central portion abuttingly engaging a shoulder formed in the sleeve of the insulator; and an optional tail portion extending through the apertures for external connections by means such as wire wrapping.

The elements of the interconnection system of the present invention further facilitates repairability in that once the contacts have been press fitted into a substrate by the insulative housing, it may be replacably removed from around the lightly engaged contacts by lifting it upwardly away from the mounting substrate. Damaged contacts may then be individually removed from the mounting substrate for replacement without effecting the remainder of the system.

In yet another aspect, the invention includes a method of assemblying an electrical connector with an insulator having a plurality of contact receiving sleeves formed therethrough, by the generally flush mounting of the insulator upon a mounting substrate. Contacts adapted for press fit mounting by the insulator are inserted into the insulator sleeves through the bottom thereof. A transversely extending portion of each contact is seated against a shoulder formed in each sleeve and is held therein by light frictional engagement. Protruding portions of the contacts are guided into aligned receiving apertures in the substrate where press fitting therein is accomplished by applying a downward force to the insulator to effect movement of the insulator and the contact relative to the substrate.

The assembly of the electrical connector is further facilitated by fabricating the contacts on a common support strip wherein they may be inserted into the insulator simultaneously. Once inserted, the support strip may be removed. By joining each contact to the support strip through a narrow reduced section, removal thereof may be accomplished by flexing the support strip in relation to the contacts. This assembly technique facilitates assembly of both the card edge and mating unit type electrical connectors.

The methods of fabrication of the contacts of the present invention further facilitate the method of assembly of the electrical connector above described. The contacts may be fabricated out of screw stock or out of sheet material by stamping and foldably forming each one into the select contact configuration. This configuration may include an S-shaped bend formed in the area of the contact collar for axially aligning upper and lower portions adjacent thereto and providing general axial symmetry therealong. Moreover while blanked contacts of any configuration are yet connected at mutual ends by a common support strip, they may be twisted in relation therewith, to the select orientation for simultaneous insertion into the contact receiving apertures of the insulator and subsequently those of the mounting substrate.

In another aspect, the invention includes methods of fabricating an insulator having load bearing inserts positioned therein. The inserts may be fabricated on a common support strip to facilitate assembly. Each insert is positioned across an insulator sleeve, either during the time of molding, to encapsulate it therein, or after molding, by bottom loading and seating the insert in the sleeve. The insulator may be of either the card edge or mating connector type for housing press fit contacts having intermediate collars thereon adapted for seating within the insulator.

BRIEF DESCRIPTION OF THE DRAWINGS

For a more complete understanding of the present invention and for further objects and advantages thereof, reference may now be had to the following description taken in conjunction with the accompanying drawings, in which:

FIG. 6 is a fragmentary, exploded perspective view of part of the electrical connector shown in FIG. 1, illustrating a row of fabricated contacts (having been twisted 90 degrees) attached to a common support strip and being bottom loaded into sleeves formed in the insulator;

FIG. 7 is a fragmentary side elevational view of the contact-insulator subassembly with part of the insulator housing cut away to illustrate the function of the insulator as a holding fixture and press fitting;

FIG. 8 is a fragmentary end elevational view of the contact-insulator subassembly during the press fit assembly to a mounting substrate;

FIG. 9 is a fragmentary end elevational view of the electrical connector of FIG. 1 with the insulator housing having been lifted upwardly and removed;

DETAILED DESCRIPTION

Figure 1:
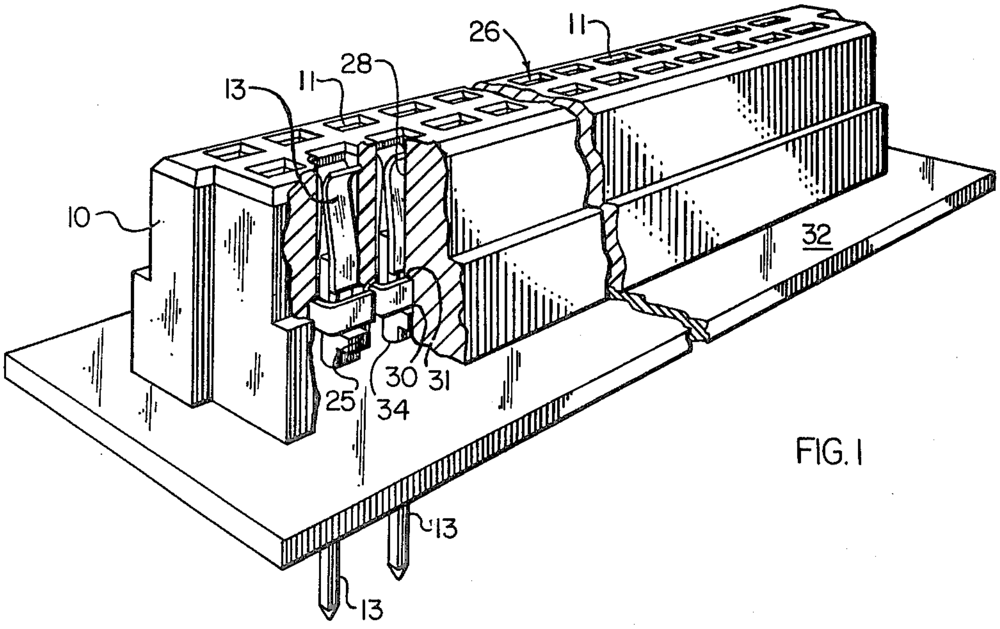
FIG. 1 is a fragmentary perspective view of an electrical connector constructed in accordance with the principles of the present invention and with a part of the insulative housing cut away to illustrate the mating engagement of a sleeve having a contact seated therein.

Referring first to FIGS. 1 and 6, there is shown in FIG. 1 a perspective view of one embodiment of an electrical connector constructed in accordance with the principles of the present invention. The connector includes a removable insulator 10 having a plurality of contact receiving sleeves 11 formed therethrough and contacts 13 seated therein. The configuration of one embodiment of a contact 13, a foldably formed, female receptacle type for insertion in the sleeves 11, is best shown in FIGS. 2, 3 and 6.

Each contact 13 of this particular embodiment includes a solid post structure having a pair of upwardly extending, transversely deflectable, gripping tines 14 forming the upper mating end thereof. Adjacent and immediately beneath the tines 14 is an intermediate portion 16 which includes a generally annular collar 18 formed substantially therearound and having shoulder portions 25 disposed immediately therebeneath just above a press fit region, or shank portion 20. While the various embodiments of the invention shown herein illustrate a contact having a shank portion 20 comprised of solid material, it should be noted that certain aspects of the present invention may include a shank section which is hollow down its central axis. For example, such a shank 20 could be formed in a hollow configuration from folded metal stock.

Figure 2:
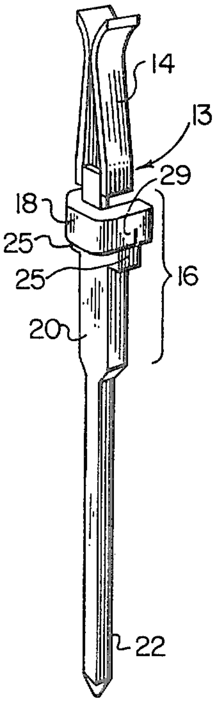
FIG. 2 is a perspective view of one of the contacts shown in FIG. 1.
Figure 3:
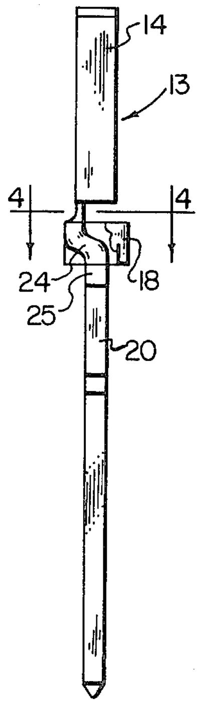
FIG. 3 is a side elevational view of the contact of FIG. 2, with a portion of a collar cut away to illustrate the construction thereof.

As shown most clearly in FIGS. 2 and 3, a generally square tail section 22 of reduced width extends downwardly from the shank portion 20 to form an optional, wire-wrap region of the contact 13. The gripping tines 14 thereabove are also preferably plated for electrical interengagement with a male contact (not shown). As is shown, the collar 18 is somewhat wider, in all directions, than the rest of the contact and provides a structurally solid transversely extending flange of increased load bearing surface area around the intermediate portion 16 of the contact 13 for accommodating and rigidly withstanding a press fit insertion force of the magnitude necessary to assemble the connector, as will be discussed in more detail below.

As shown most clearly in FIGS. 2 through 5, the upper portion of the contact 13 may be formed through a stamping and folding operation. Stamping, or coining, is used in the conventional sense to mean a progressive die forming operation; while folding, as used herein, is the forming of a bend in a stamped sheet, or post, of generally pliant conductive material, by angularly displacing one planar surface with respect to an adjacent surface, forming a crease therebetween. Both stamping and folding are preferably performed as progressive die operations. In the contact 13 of the present invention, each bend is preferably made along lines generally parallel to the longitudinal axis of the contact. The contacts 13 may thus be formed from pliant sheet metal, and a wide range of metal types and thicknesses are possible. Purely by way of example, Extra Hard Phosphor Bronze having a thickness generally on the order of 25 mils has been found to work satisfactorily.

Figure 4A:
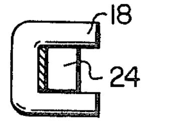
FIGS. 4A and 4B, respectively, are illustrative top plan and cross-sectional views, respectively, of two different collar embodiments for the contact of FIG. 2, taken along line 4—4.
Figure 4B:
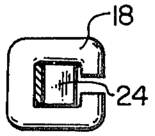
Figure 5:
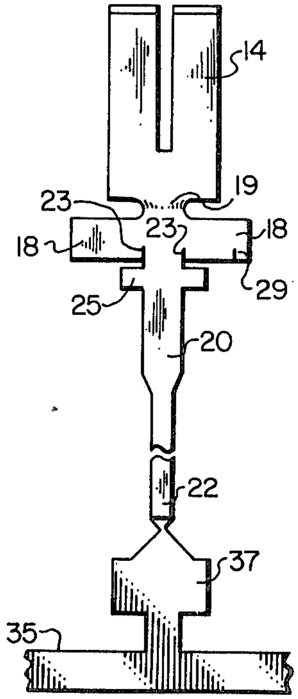
FIG. 5 is a fragmentary top plan view of a strip of contact material illustrating a single contact connected to a support strip in the blanked stage of the stamping operation.

The upper tines 14 may be configured by stamping or milling this portion of the particular flat stock utilized to a thickness generally on the order of 10 mils to produce a region of bendable thinness for forming the inwardly tapering contour shown for the contact 13. As shown in FIG. 5, stamping the tine portions form a relatively narrow transition region 19 between the two areas of differing thickness. The thinner tines 14 then extend upwardly from the thicker post region therebeneath. In the contact 13 of this particular embodiment, the solid post structure is recontoured through a longitudinal S-shaped bend 24. As shown most clearly in FIGS. 3, 4A and 4B, the collar portion 18 is then formed circumferentially around the bend 24, which positions the centerlines of the collar 18 and the tines 14 and the centerline of the shank 20 in general axial alignment with one another. In this manner, general axial symmetry is provided for facilitating interchangability of the contacts 13. Moreover, the press fit insertion forces transmitted to such an axially aligned collar 18 are more generally centered over the shank and shank engaging aperture in the mounting substrate. The term axial symmetry is used herein to mean generally symmetric about the longitudinal axis through the contact 13.

A variety of collar configurations in accordance with the principles of the present invention are possible, as will be discussed in more detail below. The two exemplary collar configurations shown in FIGS. 4A and 4B are illustrative of a difference in the extent of the periphery of the bend 24 which may be circumferentially enclosed by the collar 18 of the contact 13. The added collar portion of FIG. 4B provides an increased load bearing surface for mating engagement with an insulator, as may be necessary, depending upon the particular embodiment of the insulator of the present invention which is utilized and the crush strength of the material thereof, as discussed in more detail below.

The collar 18 of the contact 13 is provided with shoulder portions 25 immediately therebelow for structural reasons. Both the collar and shoulder are formed by the transversely extending stamped tabs, or arms, 18 and 25, respectively, shown most clearly in FIG. 5. The tab elements of the collar 18 are preferably designed to be folded toward one another, around the bend 24, although other formation configurations within the scope of the present invention are contemplated. Each collar tab element for the contact 13 as shown is formed with a lanced portion 23 separating the collar 18 from the post region to permit the subsequent partial separation therebetween and formation of the S-bend. The collar 18 thus folds substantially around the bend 24 of the contact 13, as shown in FIGS. 4A and 4B, which produces the enlarged, transversely extending flange area immediately beneath the tines 14. The shoulder 25, which is formed and positioned at the time of stamping, is disposed directly beneath the collar 18. The S-shaped recontouring bend 24 being a reduction in the longitudinal expanse of the post then brings the collar 18 and shoulder 25 into relatively close proximity, for example, on the order of 5 mils, so that the shoulder may provide an underlying support for the folded collar portions thereabove. When the longitudinal forces are applied thereto, for press fitting, the collar 18 and shoulder 25 abuttingly engage and provide the requisite longitudinal rigidity to the contact 13. In the axially symmetrical contact embodiment, as shown, were it not for the shoulder 25 supporting the collar 18, longitudinal rigidity could be lost through the relatively axially weak bend 24.

The press fit contacts constructed in accordance with the principles of the present invention, are sized and shaped for being received and seated within a removable subassembly structure in the form of an insulative housing. Referring again to FIG. 1, the insulator 10 is formed from a block of dielectric material, such as a plastic, and is adapted for housing the contacts 13 in contact receiving sleeves 11 formed therethrough. Each sleeve 11 includes a top opening 26 following the configuration of the mating element, preferably having inwardly and downwardly tapering side walls funneling to an upper sleeve portion 28. A lower sleeve portion 30 undercuts the upper portion 28 to form a transversely extending shoulder 31 therebetween. Lower portion 30 is seen to have a generally uniform cross-section of a size and shape for effecting an interference fit with the collar 18. The shoulder portion 31 lies in a plane which is generally perpendicular to the longitudinal axis of a contact so that there is substantially flush engagement between the flat lower surface of each shoulder 31 and the flat upper surface of each contact collar 18.

The contacts 13 are lightly held within the sleeves 11 of the insulator. As used herein, the term lightly held refers to a retention force generally on the order of about 0.5 to 7 pounds each, great enough to hold the contacts in the insulator but small enough to prevent dislodging the contacts from the mounting substrate after press fitting therein when the insulator is removed. This retention force is due primarily to slight frictional engagement between the outer peripheral area of the collar 18 and inner walls of the lower sleeve 30. The term frictional as used herein refers to an interference type fit provided in any of a number of ways. For example, the collar 18 and/or the wall of the lower sleeve 30 could be tapered, recessed, or dimpled to provided interference therebetween. In the particular embodiment shown, a tab section 29 preferably formed by a lanced area of the collar 18, is outwardly flared for interfering with the inner walls of the lower sleeve 30 to provide the requisite retention force therein.

The insulator 10 of the present invention for use with a contact 13 is preferably molded from a dielectric material having sufficient compressive strength to serve as a seating tool for the contacts. The presented area of the load bearing surface in the insulator is the controlling parameter for determining the minimum allowable compressive strength thereof. Insertion forces, in some instances, as high as 50–60 pounds are necessary to press fit a single contact in an aperture in a mounting substrate. However, if the load bearing region of the insulator is large enough, the crush strength of the material need not be higher than is conventional for prior art insulative housings. In present insulator design, the area of the load bearing region is very often severely limited by the space requirements between contacts. Therefore, the insulator of the present invention preferably utilizes a thermoset plastic in contrast to the thermoplastics which are conventionally used for prior art removable insulators. Purely by way of example, the glass fiber reinforced phenolic "Fiberite 4007" has been found to serve satisfactorily in accordance with the principles of the present invention. Materials, such as this reinforced phenolic, exhibit compressive strengths on the order of 35,000 to 40,000 psi, as compared to most thermoplastics having compressive strength on the order of 12,000 to 18,000 psi. The stronger materials more reliably withstand the stress concentrations across the generally small load bearing regions and structurally provide a strong but limited load bearing surface thereacross. For example, a material having a compressive strength on the order of 18,000 psi would need a minimum of about 0.0028 square inches of load bearing surface area to withstand compressive strengths on the order of 50 pounds per contact. This restricts the design approaches available due to the minimal spacing between contacts.

The insulator 10 is preferably adapted for mating with rows of male contacts in a male connector (not shown), having a plurality of round or flat blade portions, each one of which is adapted for insertion between the pair of selectively oriented, transversely resilient, gripping tines 14. However, most male contact configurations may be adapted for an insulator which is constructed in accordance with the principles of this invention.

A mounting substrate 32, which is constructed in accordance with the principles of the present invention, includes a plurality of rows of preferably circular apertures 34 which may be plated through and spaced for alignment with the sleeves 11 and consequently, a male contact configuration (not shown). The insulator and the contacts of the present invention may be structurally attached to the mounting substrate 32, such as a glass-filled epoxy printed circuit board of G-10 or FR-4 material or the like, to comprise a connector assembly or an interconnection system.

As shown most clearly in FIG. 6, it is preferable to mount the contacts 13 into the insulator sleeves 11 with a plurality of contacts joined together, either on a common support strip 35, or a bandolier (not shown) as may be necessary when the contacts are individually formed. A bandolier may be neceesary if the contacts 13 are not formed on a common support strip as when produced from screw stock. In this manner, simultaneous contact insertion is provided, overcoming many of the assembly problems of the prior art. The contacts 13, as shown, are each formed as part of the support strip 35, which is joined to the tail portion 22 of each contact by a narrow reduced section 36. The spacing and orientation of the contacts 13 is provided at the time the contacts are stamped and formed in a progressive die. Blanked from sheet material (as shown in FIG. 5), each formed contact 13 may be twisted to the required orientation for insertion in a longitudinal row of sleeves 11; e.g., 90 degrees from the plane of the strip, for insertion while still attached to the support strip 35 (as shown in FIG. 6). Such a twisted orientation may be necessary for flat-blade type mating contacts.

As seen most clearly in FIG. 6, an enlarged base tab 37 is formed adjacent the support strip 35 and is utilized to facilitate the twisting operation exhibited by the 90 degree twist region 39. By twisting the contact 13 in this area, the narrow reduced section 36 is simultaneously twisted with the contact so as to not deform or sever it therefrom. Engaging or twisting the contact 13 above the narrow reduced section would twist the tail 22 and/or cause premature separation in reduced section 36. After an elongate strip of contacts is formed and oriented on the support strip 35, the desired number of contacts is then selected and separated by cutting transversely through the common support strip 35. The desired number of contacts 13 may preferably be half the number of sleeves 11 in each insulator row (i.e., every other sleeve), for reasons of necessary spacing in contact fabrication due to the lateral extension of the tabs. In this manner, four insertion steps would be necessary to load the two row insulator 10 as presently shown.

The relative simplicity in assembly of the connector is provided by the mating designs of the contacts 13 and insulator 10. Each of the contacts 13 in a row is properly oriented and spaced from one another by the common support strip 35. As shown in FIG. 6, the tines 14 of each row of contacts 13 are inserted into the bottom openings of a row of sleeves 11 so that all the contacts on the strip are bottom loaded simultaneously. As the contacts are inserted, the tines 14 thereof pass relatively freely through the lower sleeve portion 30 and into the upper sleeve portion 28. The collar portion 18 passes through the lower sleeve portion 30 until the upper surface thereof abuts the insulator shoulder 31, seating itself thereagainst bringing the flat upper surface of the collar into substantially flush engagement with the flat lower surface of each shoulder 31. Once the contacts 13 are positioned within the sleeves 11, with the contact collar 18 abutting against the insulator shoulder 31, they are held there primarily by light frictional interference between the inner walls of the sleeve 11 and the outer peripheral area of the contact shoulder 18 as discussed above. Individual ones of the contacts 13 comprising the initially positioned row of contacts are then separated from one another by flexing the support strip 35 to sever the narrow reduced sections 36 and permit the common support strip 35 to be removed. Contacts 13 are similarly placed in the other sleeves 11 in the insulator 10.

The assembly of the contacts 13 into the mounting substrate 32 is greatly enhanced by the subassembly of the contact-insulator configuration as shown in FIG. 7. The insulator 10 having rows of contacts 13 lightly supported in the sleeves 11 thereof, is positioned above the mounting substrate 32 with the optional tail portions 22 of each of the contacts 13 being guided into and received with clearance in the substrate apertures 34. As shown in FIG. 8, the substrate may be placed upon a backup board 51 having clearance holes 52 therein and the insulator then placed beneath the ram 38 of a cylinder 40. In the event the contacts 13 are formed without the optional tail portions 22, the backup board 51 may not be necessary. When the cylinder 40 is operated to apply a downward force to the insulator 10, the lower surfaces of the insulator shoulders 31 bear against the upper surfaces of the contact collars 18 to force the contacts 13 to move downwardly through the apertures 34 and press fit the shank portions 20 therein. The insulator 10 is thus seen to serve as a holding fixture, a seating tool and a locating stop. In this manner, it precisely positions each one of the contact shanks 20 the desired depth into the mounting substrate 32 when said insulator is mounted flush thereon. As used herein, flush mounting is the term designating the abutting of a bottom portion of the insulator in its ultimate position against the mounting substrate.

In the assembled connector, the insulator 10 is still only lightly held to the contacts by the frictional engagement of each contact with the internal walls of the sleeve 11. The press fitted contacts, on the other hand, are retained in their mounting substrates by a force on the order of 10 to 60 pounds per contact position. This retention force differential permits the insulator 10 to be removed from around the contacts by lifting it upwardly while all of the contacts 13 remain firmly press fitted into the apertures 34 of the substrate 32. Moreover, the retention force differential permits a removed insulator to be reassembled to the mounted contact array without the effect of pushing the contacts further into the mounting substrate. This facilitates removal of any contact 13 from the connector without unnecessary complexity or effect upon the other contacts in the insulator 10.

In the connector of the present invention, the insulator acts not as the primary structural member, but as a holding fixture, seating tool and locating stop for simultaneously press fitting all of the contacts of the connector into the mounting substrate 32, which serves as the primary structural support for the contacts. The structure and method of the present invention enables an insulator to be completely loaded with lightly fitted contacts, transported to a remote location, and there press fitted into apertures in a mounting substrate to form a structurally complete connector assembly. In the final connector assembly, the insulator then serves as the conventional contact cover and mating guidance member. It may also be seen that similar configurations of these connector elements are within the scope of this invention.

Referring now to FIGS. 10 through 23, there are shown alternative embodiments of contacts, insulators and connectors each constructed in accordance with the principles of the present invention. Each of these elements and assemblies incorporates the concept of a removable insulator and press fit contacts which are respectively adapted for mounting in a mating subassembly to facilitate subsequent mounting on a planar substrate. Furthermore, each of these elements incorporates the approach of a contact having an upper mating portion and an intermediate press fit collar adapted for bottom loading and seating in a removable insulator having a shoulder for mating with the contact collar.

Figure 10:
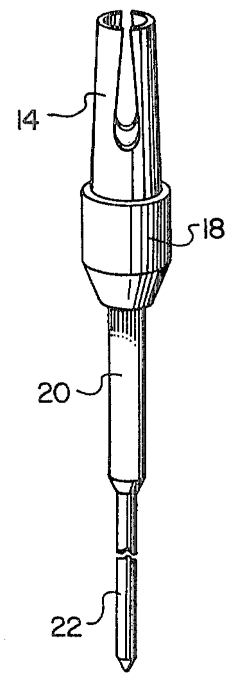
FIG. 10 is a fragmentary perspective view of an alternative embodiment of a contact constructed in accordance with one embodiment of the principles of the present invention and illustrating the configuration of a contact fabricated from screw stock.
Figure 11:
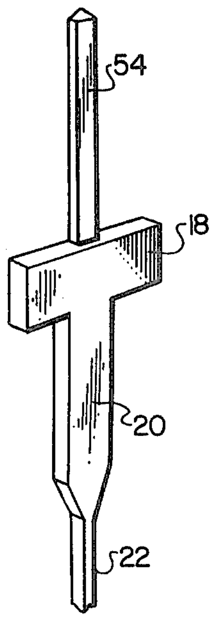
FIG. 11 is a fragmentary perspective view of an alternative embodiment of a contact, a male connecting type, constructed in accordance with the principles of the present invention.

As shown most clearly in FIGS. 10 and 11, it is not necessary that the contacts of the present invention be foldably formed from sheet material or that the collar portion be constructed in a generally annular shape, as the particular embodiment of contact 13 in FIGS. 1–9 is illustrated. This configuration is, however, both functional and economically feasible. Alternate embodiments equally functional, are shown in FIGS. 10 through 23, wherein the contacts are formed by alternative methods such as by conventional screw machining, as shown in FIG. 10. The feature of axial symmetry is exhibited in such a contact configuration by definition of construction. A transversely extending intermediate collar 18 is similarly seen for providing the requisite insulator mating engagement. The configuration of the remainder of the contact is similarly a result of the method of formation, as exhibited by the generally arcuate tines 14.

Referring now to FIG. 11, there is shown another alternative embodiment of a contact, a male type contact constructed in accordance with one embodiment of the principles of the present invention. Instead of tines 14, a blade 54 projects uprightly from the press fit collar 18 which extends transversely from the intermediate portion of the contact post. Although not folded, the collar 18 of this male contact exhibits an equivalent bearing surface area to that of contact 13. For each of the alternative contact embodiments herein, the sleeve configuration of the mating insulator is complementarily formed, as are the upper and lower sleeve portions as will be discussed in more detail below.

Figure 12:
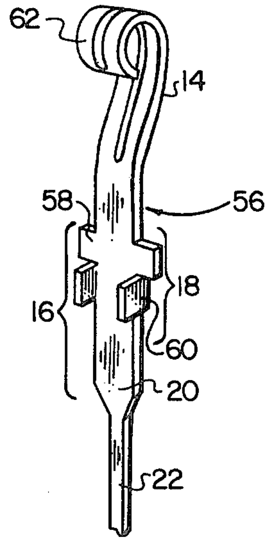
FIG. 12 is a fragmentary perspective view of another alternative embodiment of a contact, a card edge connector type, constructed in accordance with the principles of the present invention.

It is to be understood that although the connector of the invention thus far illustrated utilizes single contacts in rows, the use of opposed contact pairs is wholly within the scope of the present invention. Referring now to FIG. 12, one embodiment of a card edge connector type contact 56 is shown. Contact 56 is constructed for seating within a card edge connector insulative housing of the type disclosed in aforementioned U.S. Pat. No. 3,671,917. The contact 56 comprises a single bifurcated tine 14 uprightly extending from the intermediate portion 16, which includes a collar region 18 and shank 20. Collar region 18 of contact 56 illustrates an alternative embodiment of a collar configuration constructed in accordance with certain principles of the present invention. A pair of diametrically opposed upper tabs 58 are formed above a pair of lower, frontally extending tabs 60 to comprise the collar 18 and the necessary load bearing surface area therefor. Such a collar of multilevel flanged surfaces may be necessary when the upper mating portion is so constructed as to negate the possibility of a frontal flange surface. A sleeve shoulder for engaging such a surface for contact 56 would interfere with the reverse curvature of the bifurcated upper tine portion 62.

Figure 13:
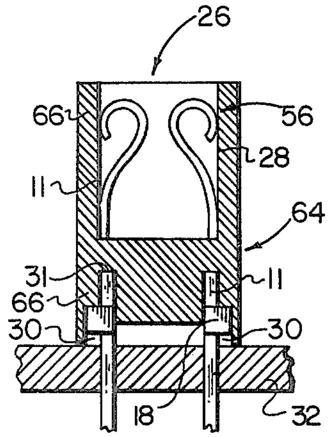
FIG. 13 is a fragmentary cross-section, side elevational view of the contact of FIG. 12 constructed into an electrical connector in accordance with one embodiment of the principles of the present invention.

Referring now to FIG. 13, there is shown a cross-section view of the contacts 56 after they have been seated in an insulator 64 and press fitted into the receiving holes 34 in the mounting substrate 32. The insulator 64 is preferably formed of a moldable insulative material as described above for insulator 10 and includes an outer shell 66 with contact receiving sleeves 11 formed therethrough. As in insulator 10, each sleeve 11 is formed with a lower portion 30 which undercuts an upper portion 28. Because insulator 64 is of the card edge type, only a single top opening 26 is needed for the contacts 56 and the upper portions 28 of each sleeve 11 includes discrete sleeve portions communicating with a common insulator cavity thereabove. The insulator 64 is divided into the plurality of discrete sleeve portions having the shoulders 31 formed therein, by separate wall sections 66 constructed to matingly engage and support the particular contact collar 18.

As shown in the cross sectional illustration of FIG. 13, the curved tine portion 62 of the contact 56 bears against the inside wall of the upper sleeve area 28, providing a transversely resilient mating structure. This paired contact configuration, although a variation of the contact shape set forth in the previously referenced U.S. Pat. No. 3,671,917, to Ammon et al, provides a similar card edge engaging function. Moreover, this design lends itself to allowing the contacts to be loaded into the insulator without camming the upper portions of the contacts first. Such an assembly method step is necessary when the card edge contacts as set forth in said Ammon et al Patent are used, as will be discussed in more detail below.

Figure 15:
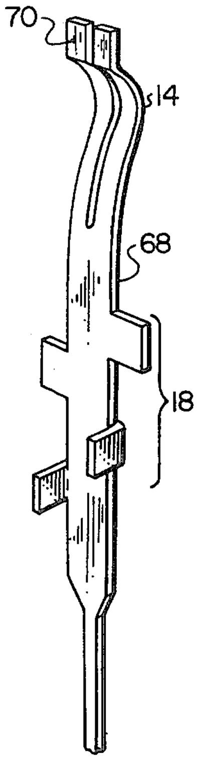
FIG. 15 is a fragmentary perspective view of the formed contact shown in the blanking stage of fabrication in FIG. 14, and of the type having an upper portion fabricated for use in a card edge connector.
Figure 14:
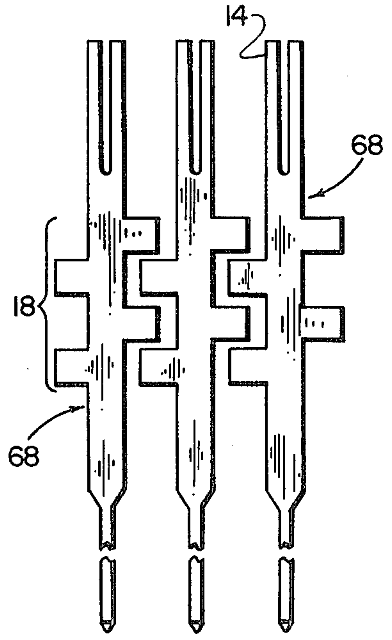
FIG. 14 is a fragmentary top plan view of a strip of contact material illustrating the blank of one embodiment of a contact and a method of fabrication thereof in accordance with certain of the principles of the present invention which tends to minimize the requisite spacing therebetween during a stamping operation.

Referring now to FIGS. 14 and 15, another embodiment of a contact in accordance with certain of the principles of the present invention is illustrated. A contact 68, of the card edge connector type, is shown in the blanking stage of fabrication in FIG. 14 and completely formed in FIG. 15. Contact 68 has an upper mating portion in the form of a bifurcated tine 14 as disclosed in said Ammon et al U.S. Pat. No. 3,671,917. The underlying collar portion 18 of contact 68 is of a staggered multilevel flange type which allows the contacts to be fabricated closer to one another to maximize efficiency and utilization of material, and reduce costs. A common problem in fabrication of such contacts with transversely extending tabs is that the spacing due to the tabs is often times too great for insertion into adjacent insulator sleeves 11. In such cases the contacts must be spaced apart for inserting into every other sleeve, using more contact material in fabrication and doubling the minimum number of insertion steps for assembly. In the staggered tab configuration, the contacts may be fabricated on minimum centers equivalent to the insulator sleeve centers.

Figure 16:
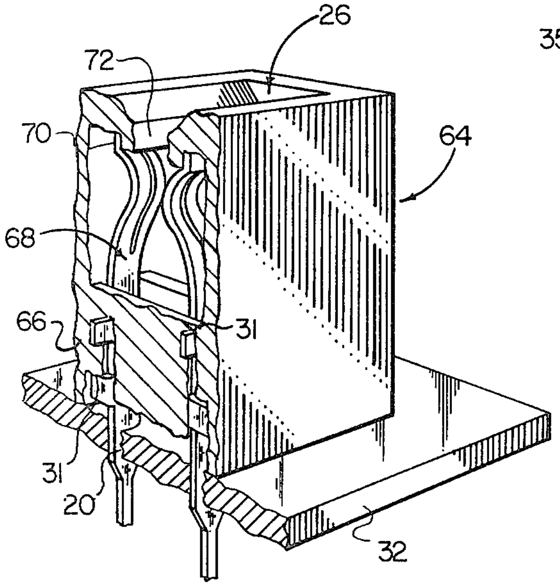
FIG. 16 is a fragmentary perspective view of a card edge connector constructed in accordance with the principles of the present invention and with a part of the insulative housing cut away to illustrate the mating engagement of the sleeves and the contacts seated therein.

Referring now to FIG. 16, there is shown a cross-section perspective view of the card edge connector type insulative housing 64 particularly adapted for the contacts 68 of FIG. 15. The wall section 66 is shown to be more intricately formed for slidably receiving the contact collar region 18 therein. As may be observed, the wall section 66 is somewhat taller than wall section 66 of FIG. 13. The added height is because of the added height of the collar 18 of contact 68 over that of the contact 56.

The bowed configuration of the contact 68 is terminated at its end by a bifurcated flange portion 70. The flange 70 is adapted to engage the innermost part of an overhanging lip portion 72 of the insulator 64, again in accordance with the principles of the Ammon et al U.S. Pat. No. 3,671,917. Similarly, as disclosed in said Ammon et al Patent, the flanges 70 must be cammed away from one another during engagement with the insulator line 72. Such an assembly technique requires the use of a separate assembly tool (not shown) in the form of a spacer inserted down through the top insulator opening 26 prior to final seating of the insulator.

Once the contacts 68 are seated in the insulator 64 with the flanges of the collar 18 abuttingly engaging the respective levels of the shoulder 31, the subassembly is ready to be mounted in a mounting substrate 32. The card edge connector of that assembly then has all the advantages of the layover insulator approach and those of the present invention. In this manner, the contacts 68 which may be lightly held in the insulator 64, may be handled as a separate card edge contact-insulator subassembly and subsequently assembled into a complete card edge connector.

Figure 17:
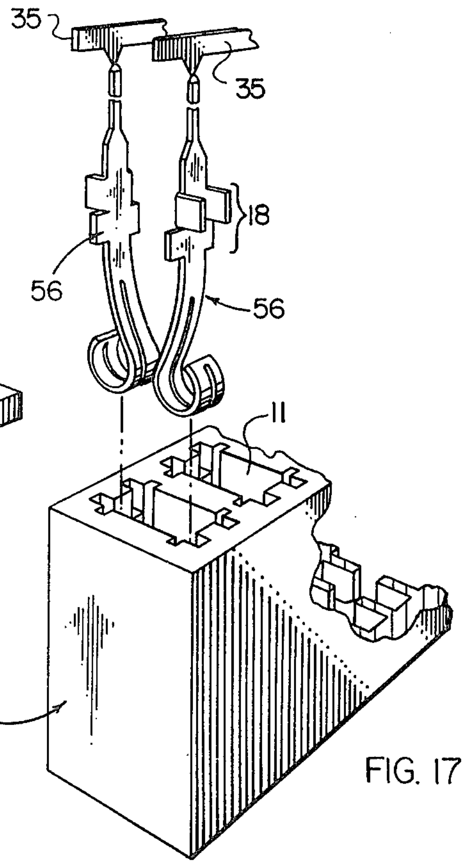
FIG. 17 is a fragmentary, exploded perspective view of a pair of card edge connector contacts, on separate rows of support strips, being simultaneously bottom loaded into a connector insulator and illustrating one method of assembly thereof.

Referring now to FIG. 17, there is shown a pair of card edge contacts 56 being bottom loaded into the insulator 64 mounted on separate carrier strips 35. It may be seen that the particular assembly method is similar to that shown in FIG. 6 for contacts 13 of FIGS. 1-9. A common support strip 35 is utilized in both cases facilitating simultaneous loading of the contacts.

Figure 18:
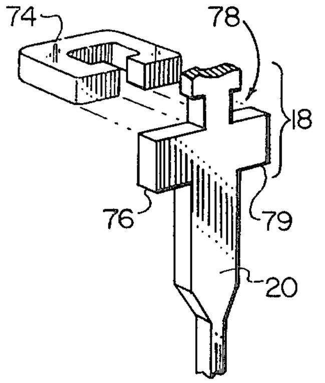
FIG. 18 is a fragmentary perspective view of an intermediate portion of a contact constructed in accordance with the principles of the present invention, and illustrating an alternative method of fabrication thereof.
Figure 23:
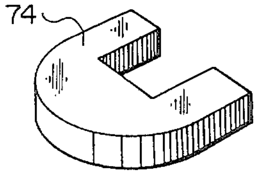
FIG. 23 is an alternative embodiment of a flange structure which may serve either as a collar for a contact or an insert for an insulator in accordance with certain principles of the present invention.

The contacts of the present invention have thus far been illustrated with integrally formed collars of maximum load bearing surface areas for a particular insulator sleeve. Variations of that approach are similarly within certain aspects of the scope of the present invention. As shown in FIG. 18, a collar portion of a contact may be comprised of an enlarged collar flange 74, separately formed by a fabrication method similar to one of those set forth above for certain of the contacts. An alternative embodiment of a flange 74 is also shown in FIG. 23. Flange 74 may be assembled and secured to the intermediate portion of the contact post in a plurality of ways. By way of example only, a neck section 78 constructed above a smaller, integrally formed collar 79, may provide a mating region onto which the flange 74 may be swaged or crimped. In this manner, the size and shape of the contact collar 18 is independently definable.

A relatively large contact collar 18 may be necessary for effectiveness in certain applications where the press fit forces are relatively high. However, large contact collars 18 may not always be feasible or economical. In such instances the shoulders 31 of the particular insulator may be strengthened.

Figure 19:
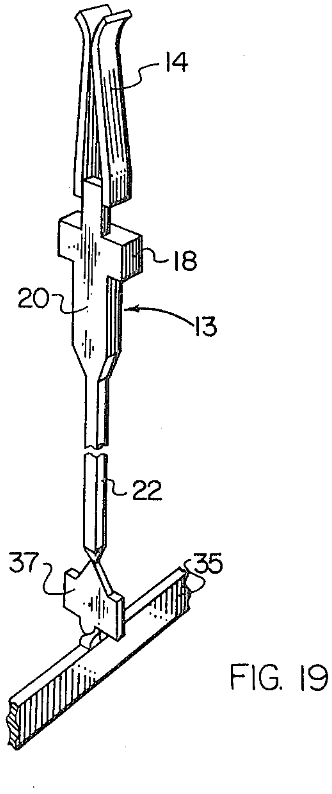
FIG. 19 is a fragmentary perspective view of an alternative embodiment of the contact of FIG. 2, illustrating an exemplary collar embodiment having a reduced load bearing surface area.
Figure 20:
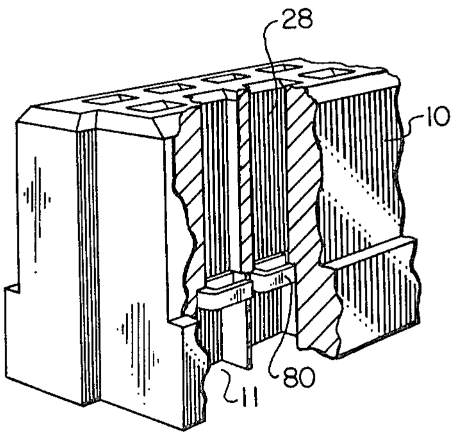
FIG. 20 is a fragmentary perspective view of an insulator constructed in accordance with the principles of the present invention with a portion thereof cut away to illustrate load bearing inserts positioned across contact receiving sleeves formed therethrough.

Referring now to FIG. 20, by way of example, there is shown an insert 80 in each sleeve 11 of an insulator 10 of the type shown in FIG. 1. The insert concept is of course applicable for other insulative housings for other types of connectors constructed in accordance with this aspect of the principles of the present invention. The insert 80 is positioned transversely across the sleeve 11, undercutting the upper sleeve area 28 and providing a transversely extending shoulder for abuttingly engaging a contact collar 18. Such a collar 18 does not need as great a load bearing surface area as one engaging the insulative material directly. Similarly, the insulative material crush strength does not have to be as high. For example, the contact 13 of FIG. 19 is shown with a collar 18 of a relatively small size which may be seated against the insert 80 in the insulator 10 fabricated of conventional insulator plastic. The press fit insertion force is then transferred from the insulator 10 through the larger insert 80 to the contact 13 through the smaller collar 18.

Figure 21:
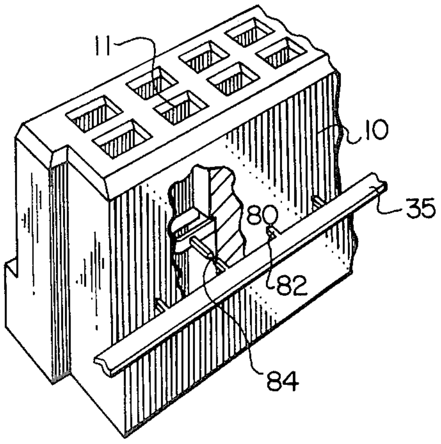
FIG. 21 is a fragmentary perspective view of an insulator having inserts, connected on a common support strip, molded across sleeves formed therein, illustrating one method of fabricating the insulator of FIG. 20.
Figure 22:
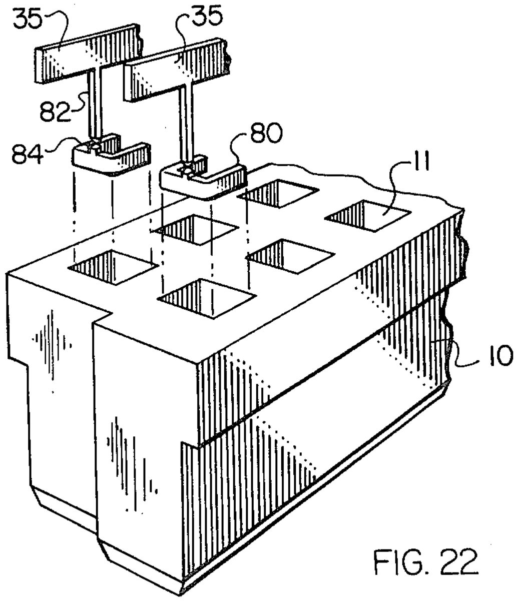
FIG. 22 is a fragmentary, exploded perspective view of an insulator having inserts, connected on a common support strip, being bottom loaded into sleeves formed therein, illustrating an alternative method of fabricating the insulator of FIG. 20.

Referring now to FIGS. 21 and 22, there are shown two exemplary methods of assembling an insert 80 in an insulator. The configuration of the particular type of insulator 10 of FIG. 20 is shown for illustration purposes. Inserts 80 are similarly shown fabricated on a continuous support strip 35 for facilitating assembly in a simultaneous manner. In FIG. 21 the inserts 80 are shown molded in the insulator by their positioning within the insulator mold cavity (not shown) across the sleeve 11. The inserts 80 are connected to and transversely extend from the support strip 35 by connecting fingers 82. By providing a reduced section 84 on each finger 82 in the area of the outside insulator wall, the support strip 35 can be removed after molding by flexing it along side the insulator to sever the plurality of fingers 82 across said reduced sections.

As shown in FIG. 22, the inserts 80 may also be bottom loaded and seated in a molded insulator. The inserts 80 are similarly provided on a common support strip 35 in this embodiment. By forming or orienting each insert 80 transverse to the support strip 35, they may be simultaneously inserted against the shoulder molded in the insulator sleeve 11. Each finger 82 is similarly formed with a necked section 84 adjacent the underside of the insert 80 for subsequent severing. The insulators having inserts so positioned therein may then be used in accordance with the teachings of this invention with contacts having intermediate collars 18 of relatively smaller size and shape.

It is believed the operation and construction of the above described invention will be apparent from the foregoing description. While the electrical connector and the method of assembly thereof shown and described has been characterized as being preferred, it will be obvious that various changes and modifications may be made therein without departing from the spirit and scope of the invention as defined in the following claims.

What is claimed is:

1. An electrical connector comprising:

a mounting substrate having contact receiving apertures therein, said apertures forming arrays lying along linear paths;

an insulative housing having a plurality of sleeves formed therethrough in spaced alignment with said apertures, each of said sleeves being constructed with a lower portion which undercuts an upper portion to define a generally transversely extending insertion load bearing shoulder therebetween for transmitting a press fitting force from said housing to each contact; and contacts received into said sleeves through the lower portion thereof, said contacts each including an upper mating portion and an intermediate, generally transversely extending insertion load bearing collar portion which abuttingly engages said shoulder within said sleeve for receiving a press fitting force from said housing, said contacts also having a press fit shank portion extending downwardly from said collar through said apertures and in interfering engagement therewith for securing said contacts tight and motionless therein and permitting said insulative housing to be removed from said contacts while said contacts remain rigidly mounted in said substrate.

2. An electrical connector as set forth in claim 1 wherein said connector is of the female receptacle type and each of said contacts comprises:

an upper receptacle portion for mating engagement with a male contact; and an intermediate portion including said collar and shank portions, an upper area of said intermediate portion being in light frictional engagement with the inner walls of said sleeves to hold said contacts in position within said housing and said shank being in rigid interfering engagement with the inner walls of the apertures in said substrate.

3. An electrical connector as set forth in claim 2 wherein said contacts are held within said insulator sleeves by a retention force less than 7 pounds per contact position and said contacts are held within said apertures in said mounting substrate by a force in excess of 10 pounds per contact position.

4. An electrical connector as set forth in claim 1 where each of said contacts also includes a tail portion extending downwardly from said shank portion and protruding beneath said mounting substrate.

5. An electrical connector assembly adapted for structural mounting to a substrate having contact receiving apertures formed therein, comprising:

a removable insulative housing having a plurality of sleeves formed therethrough in spaced alignment with said apertures, each of said sleeves being constructed with a lower portion which undercuts an upper portion, said undercut forming an insertion load bearing shoulder therebetween for receiving a contact mating portion and transmitting a press fitting force thereto, and contacts received into said sleeves through the lower portion thereof, said contacts each including an upper mating portion, an intermediate insertion load bearing collar portion abuttingly engaging the shoulder of said sleeve for receiving a press fitting force therefrom, and a shank portion beneath said collar portion for press fit insertion and rigid mounting in the substrate, said contacts being held in position within the housing by frictional engagement with the inner walls of said sleeves to permit subsequent press fitting of said contacts into the apertures in the substrate, said contacts being adapted for the structural mounting by press fitting the contacts into the apertures in the substrate through the application of a downward press fitting force to said insulative housing for transmitting press fitting forces from said insulative housing to said contacts through the abutting engagement of said insertion load bearing contact collars and said insertion load bearing sleeve shoulders.

6. An electrical connector adapted for structural mounting to a substrate as set forth in claim 5 wherein said connector is of the female receptacle type and each of said contacts comprises:

an upper receptacle portion for mating engagement with a male contact; and an intermediate portion including said collar and a shank portion extending downwardly therefrom, said shank portion projecting from said sleeve for interference engagement with said apertures.

7. An electrical connector adapted for structural mounting to a substrate as set forth in claim 6 wherein:

said upper receptacle portion of said contact includes a pair of upwardly extending transversely resilient tines adapted for gripping a male conducting element positioned therebetween; and said intermediate portion of said contact also includes a transversely extending shoulder portion abutting the lower edge of said insertion load bearing collar to provide a supporting surface therebeneath of the reinforcement thereof during the application of the longitudinal press fitting insertion forces.

8. An electrical connector adapted for structural mounting to a substrate as set forth in claim 6 wherein each of said contacts further comprises a lower tail portion, integrally formed and generally axially aligned with, but narrower than, said intermediate portion for projection through said mounting substrate by the mounting of said insulative housing thereupon.

9. An interconnection system for electrical connectors, comprising:

a mounting substrate having contact receiving apertures therein, said apertures forming arrays lying along linear paths;

removable insulative housing having a plurality of sleeves formed therethrough in spaced alignment with said apertures, each of said sleeves being constructed with a lower portion which undercuts an upper portion to define a generally transversely extending insertion load bearing shoulder therebetween for transmitting a press fitting force from said housing to said contacts; and contacts received into said sleeves through the lower portion thereof, each of said contacts including, an upper portion for engagement with a mating contact, said upper portion disposed within said upper portion of said sleeve; and an intermediate portion including a collar and shank, said collar defining on said contact a transversely extending insertion load bearing flange intermediate thereof for receiving a press fitting force, said flange abuttingly engaging said sleeve shoulder, said shank formed adjacent to and extending downwardly from said collar and outwardly from said insulator through said aperture in said mounting substrate in interfering engagement therewith.

10. An interconnection system for electrical connectors as set forth in claim 9, wherein each of said contacts further includes a lower tail portion, integrally formed and generally axially aligned with, but narrower than, said intermediate portion for protruding beneath said mounting substrate.

11. An interconnection system for electrical connectors as set forth in claim 9, wherein said collar includes a first tab element extending outwardly from said intermediate portion, and tab having a substantially planar upper surface defining said flange area.

12. An interconnection system for electrical connectors as set forth in claim 9, wherein said collar includes a pair of tabs extending diametrically outwardly from said contact intermediate portion, said tabs having substantially planar upper surfaces for defining said flange area.

13. An interconnection system for electrical connectors as set forth in claim 9, wherein said collar includes a flange element secured to an upper section of said intermediate contact portion in a generally transversely extending configuration thereacross.

14. An interconnection system for electrical connectors as set forth in claim 9 wherein said contact is formed from sheet material and said upper contact portion and said shank extend from opposite longitudinal ends of said collar in generally axial alignment through a recontouring of said contact in an S-shaped bend in the area of said collar for providing general axial symmetry therealong.

15. An interconnection system for electrical connectors as set forth in claim 14 wherein:

said mating portion of said contact includes a pair of upwardly extending transversely deflectable tines adapted for mechanical and electrical connection with a conducting element positioned therebetween.

16. An interconnection system for electrical connectors as set forth in claim 14 wherein:

said intermediate portion of said contact also includes a support shoulder portion beneath said collar for providing a supporting surface therebeneath for the reinforcement thereof against longitudinal forces applied thereto.

17. An interconnection system for electrical connectors as set forth in claim 9 wherein:

said intermediate portion of said contact being in light frictional engagement with the inner walls of said sleeve.

18. An electrical connector comprising:

a mounting substrate having contact receiving apertures therein, said apertures forming arrays lying along linear paths;

an insulative housing having a plurality of sleeves formed therethrough in spaced alignment with said apertures, each of said sleeves being constructed with a lower portion which undercuts an upper portion to define a generally transversely extending insertion load bearing shoulder therebetween for transmitting a press fitting force of at least 20 pounds from said housing to each contact; and contacts received into said sleeves through the lower portion thereof, said contacts each including an upper mating portion and an intermediate, generally transversely extending insertion load bearing collar portion which abuttingly engages said shoulder within said sleeve for receiving a press fitting force of at least 20 pounds from said housing, said contacts also having a press fit shank portion extending downwardly from said collar through said apertures and in interfering engagement therewith for securing said contacts tight and motionless therein and permitting said insulative housing to be removed from said contacts while said contacts remain rigidly mounted in said substrate.

19. An electrical connector assembly adapted for structural mounting to a substrate having contact receiving apertures formed therein, comprising:

a removable insulative housing having a plurality of sleeves formed therethrough in spaced alignment with said apertures, each of said sleeves being constructed with a lower portion which undercuts an upper portion, said undercut forming an insertion load bearing shoulder therebetween for receiving a contact mating portion and transmitting an axial press fitting force of at least 20 pounds thereto, and contacts received into said sleeves through the lower portion thereof, said contacts each including an upper mating portion, an intermediate insertion load bearing collar portion abuttingly engaging the shoulder of said sleeve for receiving a press fitting force of at least 20 pounds therefrom, and a shank portion beneath said collar portion for press fit insertion and rigid mounting in the substrate, said contacts being held in position within the housing by frictional engagement with the inner walls of said sleeves to permit subsequent press fitting of said contacts into the apertures in the substrate, said contacts being adapted for the structural mounting by press fitting the contacts into the apertures in the substrate through the application of a downward press fitting force of at least 20 pounds to said insulative housing for transmitting press fitting forces from said insulative housing to said contacts through the abutting engagement of said insertion load bearing contact collars and said insertion load bearing shoulders.

20. An interconnection system for electrical connectors, comprising:

a mounting substrate having contact receiving apertures therein, said apertures forming arrays lying along linear paths;

removable insulative housing having a plurality of sleeves formed therethrough in spaced alignment with said apertures, each of said sleeves being constructed with a lower portion which undercuts an upper portion to define a generally transversely extending insertion load bearing shoulder therebetween for transmitting a press fitting force of at least 20 pounds from said housing to said contacts; and contacts received into said sleeves through the lower portion thereof, each of said contacts including, an upper portion for engagement with a mating contact, said upper portion disposed within said upper portion of said sleeve; and an intermediate portion including a collar and shank, said collar defining on said contact a transversely extending insertion load bearing flange intermediate thereof for receiving a press fitting force of at least 20 pounds, said flange abuttingly engaging said sleeve shoulder, said shank formed adjacent to and extending downwardly from said collar and outwardly from said insulator through said aperture in said mounting substrate in interfering engagement therewith.

* * * * *